United States Patent
Emerson et al.

(10) Patent No.: US 10,448,503 B1
(45) Date of Patent: Oct. 15, 2019

(54) COPLANER LED ARRAY AND DRIVER ASSEMBLY

(71) Applicant: Light & Motion Industries, Marina, CA (US)

(72) Inventors: Daniel T. Emerson, Carmel, CA (US); Brooks Patrick Lame, Seaside, CA (US); David William Tolan, Carmel, CA (US); Jarod Armer, Royal Oaks, CA (US)

(73) Assignee: Light & Motion Industries, Marina, CA (US)

( * ) Notice: Subject to any disclaimer, the term of this patent is extended or adjusted under 35 U.S.C. 154(b) by 0 days.

(21) Appl. No.: 15/973,382

(22) Filed: May 7, 2018

(51) Int. Cl.
| H05K 1/02 | (2006.01) |
| H05K 1/11 | (2006.01) |
| H05K 1/18 | (2006.01) |
| H05K 7/20 | (2006.01) |
| H01K 1/02 | (2006.01) |

(52) U.S. Cl.
CPC ........... H05K 1/0278 (2013.01); H05K 1/119 (2013.01); H05K 1/18 (2013.01); H05K 7/2049 (2013.01); H05K 2201/012 (2013.01); H05K 2201/09027 (2013.01); H05K 2201/10106 (2013.01)

(58) Field of Classification Search
None
See application file for complete search history.

(56) References Cited

U.S. PATENT DOCUMENTS

| 7,303,301 | B2* | 12/2007 | Koren | F21V 23/02 362/101 |
| 8,757,852 | B2* | 6/2014 | Lopez | F21K 9/00 362/294 |
| 8,864,326 | B2* | 10/2014 | Armer | G03B 15/02 362/6 |
| 9,611,982 | B2* | 4/2017 | Armstrong | F21V 29/20 |
| 9,746,170 | B1* | 8/2017 | Armer | B63C 11/02 |
| 9,863,629 | B2* | 1/2018 | Doyle | F21V 31/005 |
| 10,222,031 | B1* | 3/2019 | Olsson | F21V 31/005 |
| 2005/0047122 | A1* | 3/2005 | Kuo | B63C 11/205 362/158 |
| 2006/0067077 | A1* | 3/2006 | Kumthampinij | F21L 4/027 362/294 |
| 2007/0279900 | A1* | 12/2007 | Bauer | F21S 8/00 362/158 |
| 2009/0154164 | A1* | 6/2009 | Hsu | F21S 8/00 362/267 |
| 2009/0201683 | A1* | 8/2009 | Chuan | F21V 29/004 362/294 |

(Continued)

*Primary Examiner* — Evren Seven
(74) *Attorney, Agent, or Firm* — Thomas M. Freiburger

(57) ABSTRACT

An LED array and driver design minimizes space requirements and simplifies assembly, while reducing costs. A printed circuit board with LED driver electronics has a central opening through which the LED array is mounted. In one form the LED array is a chip on board (COB) array, the array being circular and fitting closely within the central opening of the PCB. Four integral leaf springs are formed into the flat PCB, in position to push the LED array down when the PCB and LED array are attached against the heat sink. Two of the springs have electrical contacts that make contact with those of the LED array. With the LED array and driver circuit on the face of a light assembly, the space rear of the driver circuit is free to be open to air flow for cooling.

11 Claims, 8 Drawing Sheets

(56) References Cited

U.S. PATENT DOCUMENTS

| | | | |
|---|---|---|---|
| 2009/0290343 A1* | 11/2009 | Brown | F21K 9/00 362/235 |
| 2010/0033948 A1* | 2/2010 | Harbers | F21V 17/02 362/84 |
| 2010/0225220 A1* | 9/2010 | Tanaka | F21V 31/005 313/46 |
| 2010/0315812 A1* | 12/2010 | Liu | F21S 8/02 362/235 |
| 2014/0063794 A1* | 3/2014 | Parekh | F21S 8/04 362/185 |
| 2017/0303388 A1* | 10/2017 | Mathewson | H05K 1/028 |
| 2019/0008045 A1* | 1/2019 | Iedema | H05K 1/142 |

* cited by examiner

COPLANER LED ARRAY AND DRIVER ASSEMBLY

BACKGROUND OF THE INVENTION

This invention concerns LED lighting devices, and is directed particularly to an efficient assembly of an LED array and a heat sink, which can also include LED electronics.

Newer, more powerful LED arrays, instead of being surface mounted as individual LEDs on a PCB, are constructed as a larger tight array of LEDs. Also they can be "grown" on a single silicon chip and clustered together on a wafer. These are called chip-on-board or COB. There can be many dozens of individual LEDs in an array or cluster. Alternatively, newer LEDs such as the Cree XD 16 individual diodes are designed to allow building of tight clusters of LEDs that can potentially mix a range of wavelengths in a tight cluster of the same or similar size to the COB arrays. These arrays are mounted on a heat conducting substrate ranging from aluminum to copper or ceramic. The entire back surface of the mounted array needs to maintain strong thermal contact with a heat sink for cooling of LEDs in order to maximize light output. Manufacturers sell a wide range of carriers designed to make electrical contact with the LED array and maintain force to hold the array against a heat sink. These holders or carriers are expensive and take up space in the device. A typical assembly would have a holder, a heat sink and a separate driver that powers the LED. As an example, see U.S. Pat. No. 9,746,170, owned by the assignee of this invention.

To minimize costs as well as to make the design small and compact for a lightweight product, it would be desirable to remove the typical holder and efficiently fix the LED array in place while making tight thermal contact within the heat sink and secure electrical connection for the LED array. In addition it would be advantageous to integrate the holding function into the driver PCB.

SUMMARY OF THE INVENTION

The design developed according to the invention preferably uses the inherent strength of the PCB "FR4" material, a type of fiberglass that is naturally strong and heat resistant. The general practice for manufacturing PCBs is to define a shape and rout the shape out of a rectangular sheet with a two axis mill. This allows for a wide range of shapes and details. For the assembly of the invention, a donut shape is employed in a preferred embodiment, with a series of spring arms routed into the PCB at the inner side adjacent to a central hole (other shapes could be used if desired). Two of the spring arms have a wire trace with a contact positioned to mate against the + and − terminals of the LED array, which may be a COB array or other tight placement array. In this embodiment the driver PCB is routed on its back side, around the central hole, with a recess to allow for part of the depth of the COB or tight array assuming the array is mounted on a flat heat sink together with the donut or annular shaped driver.

The LED driver electronics in a preferred embodiment surround the COB array in an essentially coplanar assembly making for a very space efficient design with no need for a secondary holder or wired or other indirect connections between LED and holder and holder and driver PCB. With this design the driver PCB directly connects to the LED array through contact on the appropriately placed spring arms.

Two additional spring arms are at 90 degrees to the positive and negative arms to evenly distribute the pressure on the COB so as to create good thermal contact with the heat sink on which everything is mounted.

More broadly the invention in its more basic form is a donut or square PCB (or other polygonal shape) surrounding an LED array with spring arms formed in the PCB to engage the LED, apply pressure to aid thermal transfer, and to make secure electrical contact to deliver power to the LED, whether or not the PCB has the driver electronics mounted directly on it. The PCB with the spring arms can simply be an efficient holder, with the electrical contact transferred to a remote driver using the inherent electrical functionality of PCB manufacture, with layers of copper in the PCB.

The invention can be incorporated in a portable light, and also in a stationary light of any kind.

The advantages of the design are a far more compact system with simple, cost effective assembly and a simple heat sink that has the entire rear facing side open for cooling. These and other objects, advantages and features of the invention will be apparent from the following description of a preferred embodiment, considered along with the accompanying drawings.

DESCRIPTION OF PREFERRED EMBODIMENTS

The drawings show a special printed circuit board (PCB) 10 for LED driver electronics, and an LED array for assembly onto that PCB, forming an efficient and compact printed circuit board assembly (PCBA). Not shown is the donut PCB populated with the LED drive circuit. The LED array, in a preferred embodiment, is a COB array 12. Other tight arrays could be used, such as Cree XD-16 dies, designed to be located closely together and enabling creation of an array equivalent to a custom COB that can have individually addressed dies or groups of diodes. If desired these groups can have different wavelengths of light for mixing a changing color.

Figure 1:
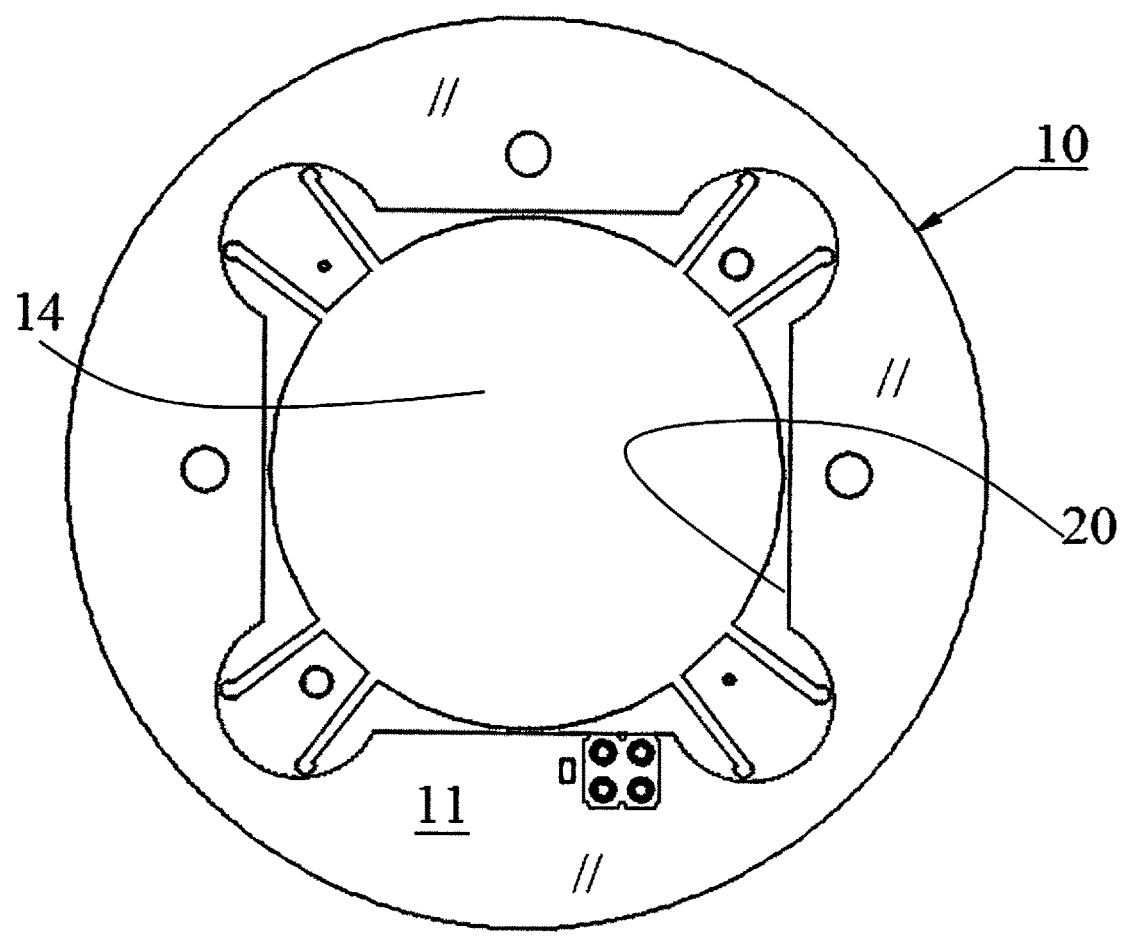
FIG. 1 is a plan view showing the back side or heat sink side of a donut printed circuit board (PCB) of the invention.

In FIG. 1 the "donut" LED driver PCB 10 is shown in plan view, illustrating the underside or back side 11 of the PCB, i.e. not the side facing toward the projection of light. This preferred "donut" PCB is annular in shape, with a central round opening 14. The PCB can be of a strong fiberreinforced material, such as the material "FR4", a type of fiberglass that is naturally strong and heat resistant.

Figure 4:
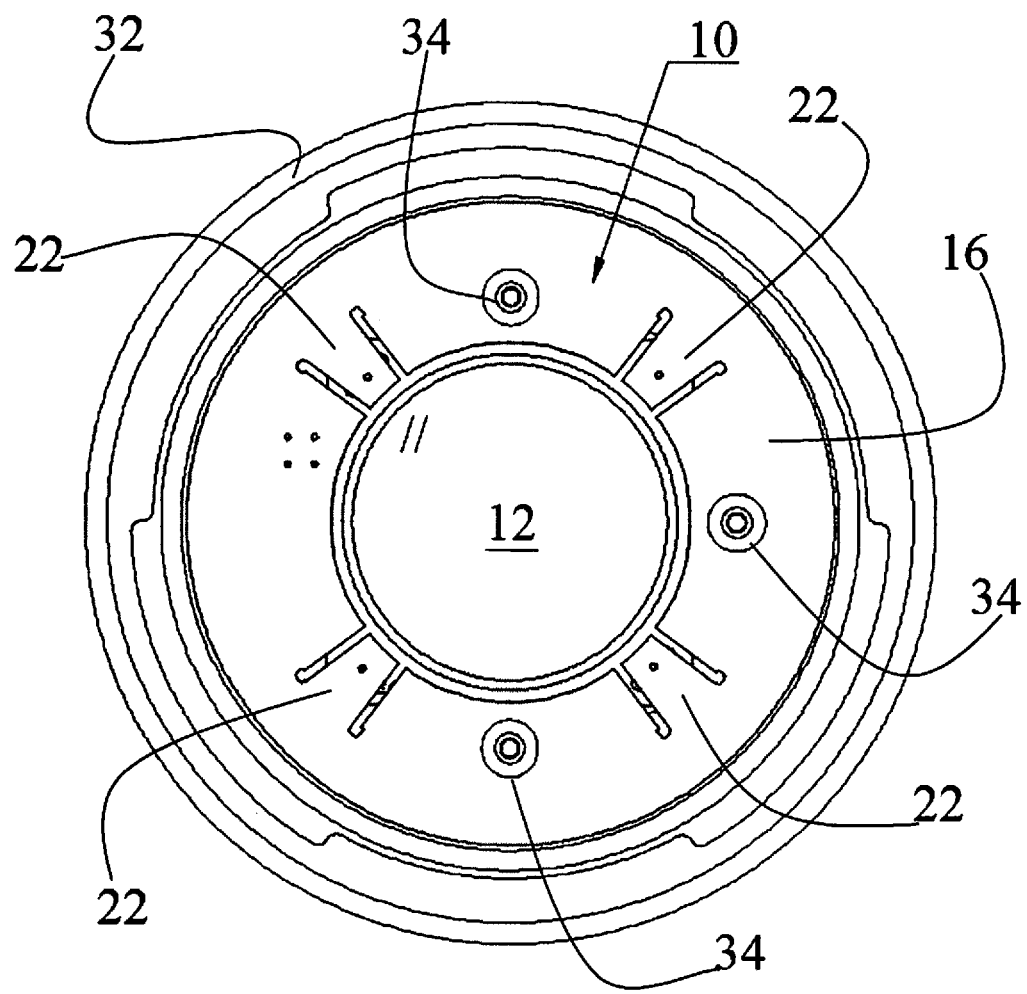
FIG. 4 is a front plan view showing the assembled PCB and LED array, secured to a heat sink plate immediately behind the LED array.

The driver PCBA 16 is screwed down to a heat sink 18, as shown in FIG. 4, which applies a downward heat transferring force against the LED array and also makes electrical contact with the LED COB or other array 12.

Figure 2:
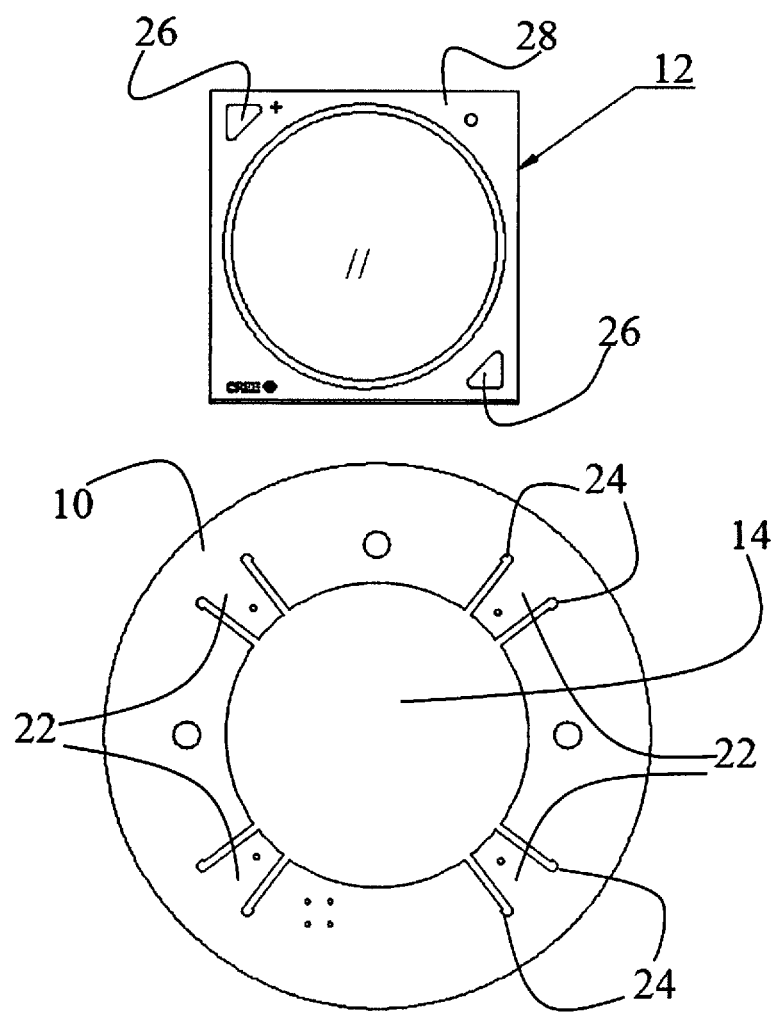
FIG. 2 is a frontal plan view showing the donut PCB, with a COB LED array alongside.
Figure 3:
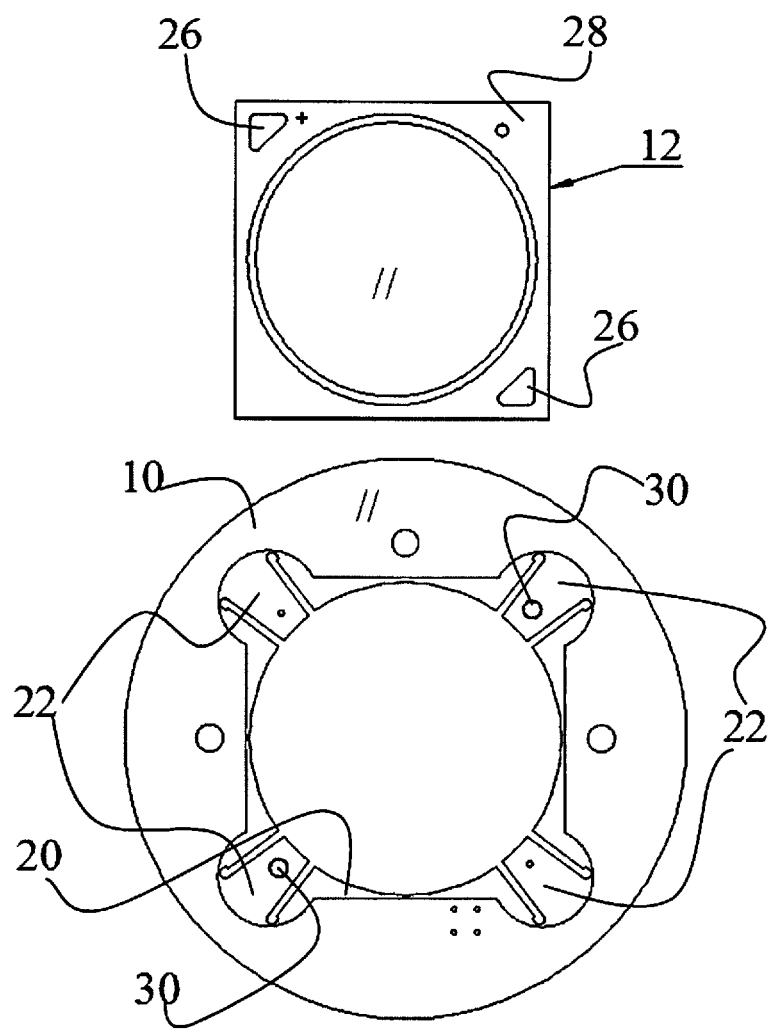
FIG. 3 is a plan view showing the same components, but showing the donut PCB from the back side and showing the LED array in position to be flipped over and assembled to the back of the PCB.

FIGS. 2 and 3 show that the underside of the PCB 10 is routed out, preferably into a square (or diamond shape) with corners expanded out, to form a recess 20 to locate and position the COB in assembly and hold it in place. The corners of the recess are each shown here as a partially-circular rout, located at each of four spring arms 22 of the PCB. The expanded corners allow the spring arms free action. As described above, the spring arms are formed by cutting slits 24 through the PC board as shown in the drawings. These slits form a cantilevered spring arm for exerting heat-conducting pressure to the array against the heat sink and for making electrical contact. The contacts on the LED array 12 are shown at 26 at two opposed corners of the square ceramic heat-conducting backing 28 of the illustrated COB. The two spring arms have contacts at 30, as seen in FIG. 3, and these will be in springing contact against the COB electrical contacts 26 when the assembly is made. Note that if a light mixing array is used as discussed above, four or even six spring arms with electrical contacts may be needed to allow the driver to control different combinations of LEDs on the array.

Figure 6:
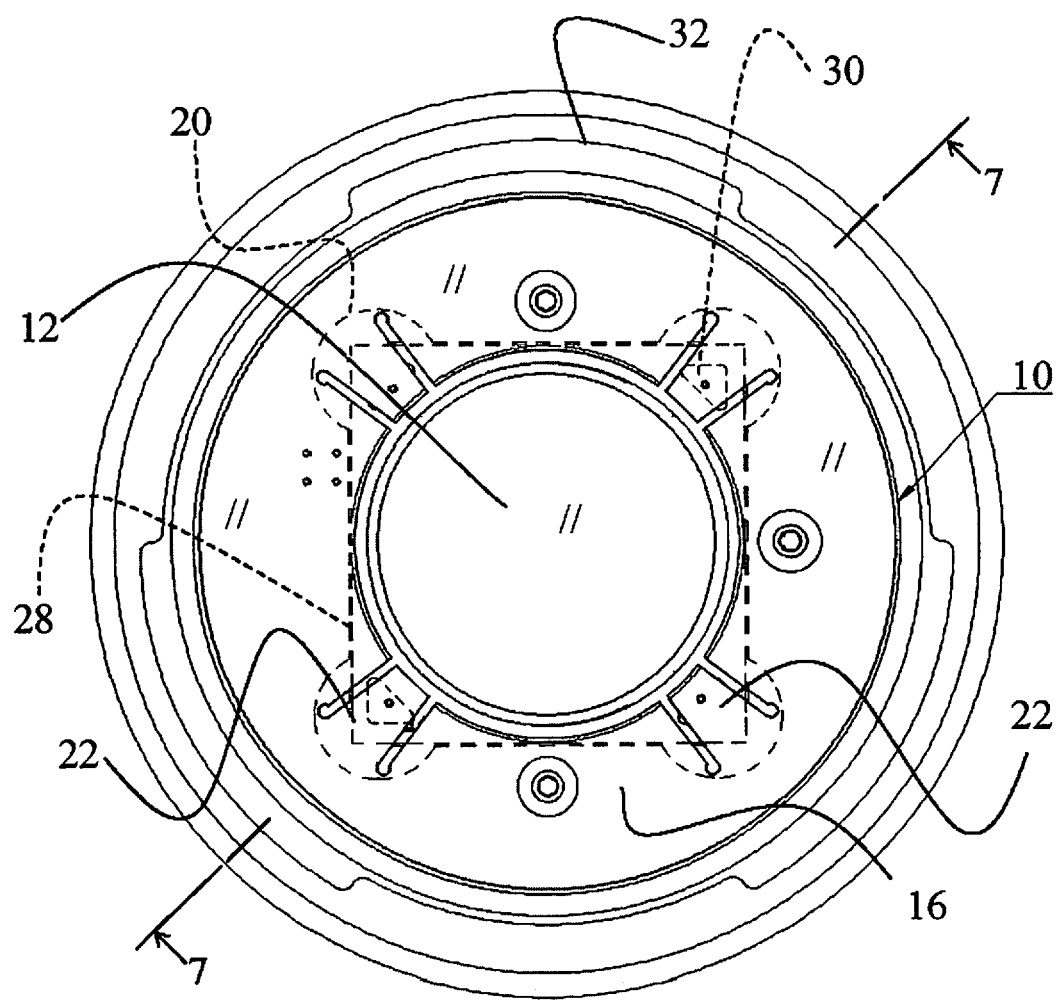
FIGS. 6 and 7 are plan and sectional views showing the relationship of the LED array, the PCB and the heat sink plate.
Figure 7:
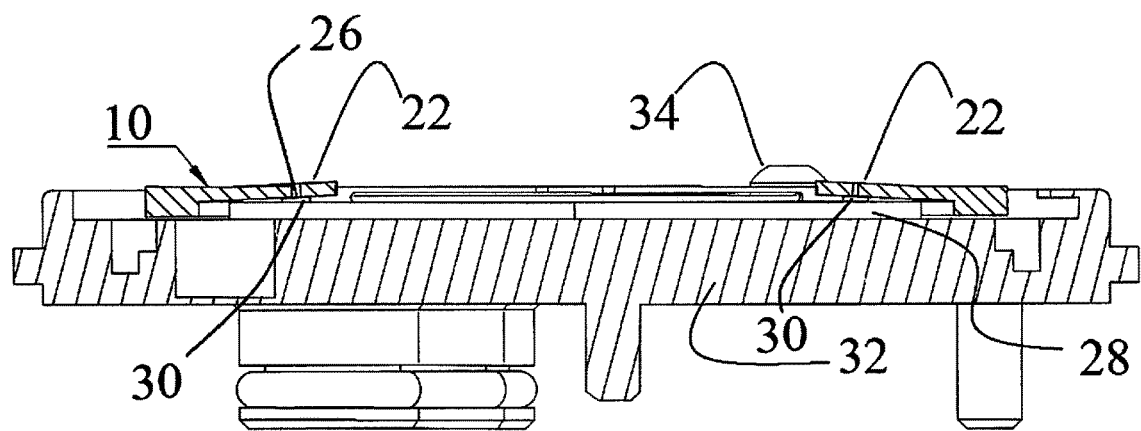

FIG. 4 shows the PCB 10 and COB LED array 12 assembled together and down against a circular heat sink plate 32. The COB LED array 12 has a depth, as does the heat conducting substrate 28 (usually aluminum, copper or ceramic). The depth of the COB's substrate 28 preferably is greater than that of the routed recess 20 in the underside of the PCB, so that when the LED array 12 is assembled into the back of the PCB 10, essentially by flipping over the array 12 onto the underside of the PCB as indicated in FIG. 3, the COB's substrate 28 extends out, proud of the underside surface 11 of the PCB (see FIG. 7, showing the substrate 28 extending downwardly). Thus, when the assembly is made as in FIG. 4, using a plurality of threaded fasteners (machine screws) as at 34, this will cause the spring arms 22 to press down on the heat-conducting substrate 28. See FIG. 7, a sectional view seen along the line 7-7 in FIG. 6. The spring arms 22 are deflected elastically as the PCB is drawn down. Each of the four corners of the COB's heat conducting substrate 28 is engaged by the spring arms, as can be envisioned from FIG. 3. The routed area 20 of the PCB, just adjacent to each spring arm, would also contact the substrate 28 as the PCB is drawn down, but for one thing: the spring arms do not fully engage against the substrate 28; the electrical contacts 26 and 30 form a small proud feature holding the surfaces apart (on the order of about 0.5 mm), and the two non-electrical spring arms 22 include a lump or protrusion of similar dimension (not shown), so that all four spring arms apply approximately equal force on the substrate 28 against the heat sink plate 32, and other areas of the PCB need not contact the substrate 28. See FIG. 7. Both FIGS. 6 and 7 demonstrate the positional and dimensional relationship of the COB in the rout recess 20 (dashed in FIG. 6, as is the substrate 28), along with the heat sink plate 32 behind.

Figure 5:
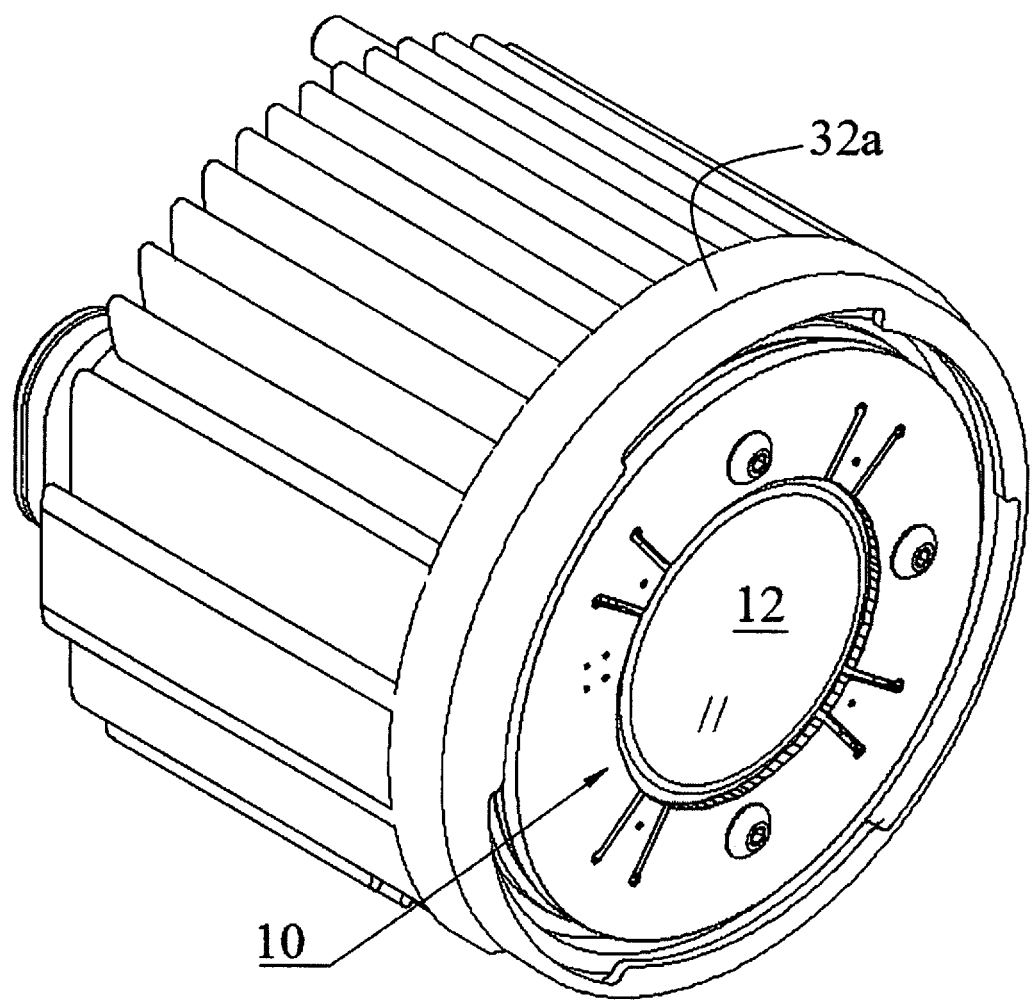
FIG. 5 is a perspective view showing the assembly secured to a finned heat sink.

FIG. 5 shows an example of a finned heat sink 32a as a part of the assembly. The heat sink plate 32 seen in FIGS. 4, 6 and 7 is part of this structure.

Figure 8:
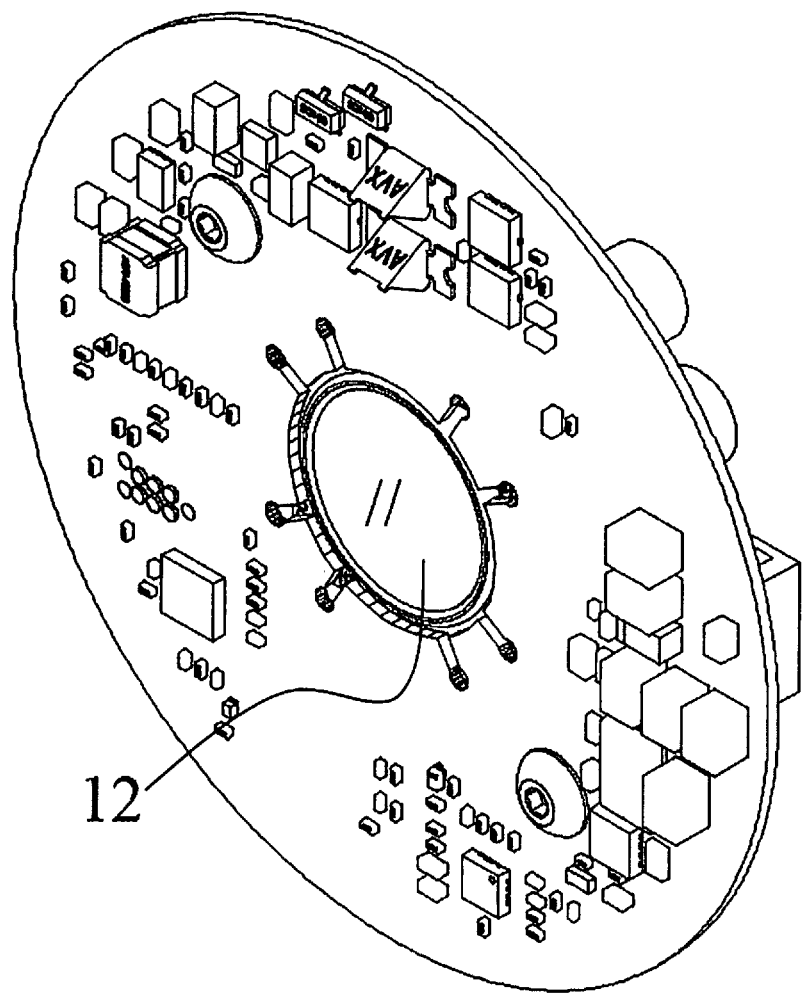
FIG. 8 is a perspective view showing an LED array/PCB assembly with LED driver electronics on the outer side of the PCB.

As noted, the drawings do not show the PCB circuitry mounted on the PCB. The circuitry can be on the underside of the PCB, between corners of the substrate 28 (i.e. the large surface areas shown in FIGS. 1 and 3), or the circuitry can be on the front or outer side 16, or both. FIG. 8 shows driver circuitry on the outer side of the PCB, connections being made using the conductive layers of the PCB. As is seen from the drawings and the above discussion, this assembly uses the spring arms 22 to make firm electrical connection to the PCB array, while also pressing the LED's substrate 28 firmly and evenly against the heat sink 32 for efficient heat transfer and cooling of the LEDs.

An alternative design would be to machine a recess in the heat sink for the LED COB (or other tight array) to drop into while being slightly proud of the heat sink and then screwing down the driver PCBA on the upper surface of the heat sink, flexing the spring arms and accomplishing the same force plus electrical contact.

A populated driver PCBA, as exemplified in FIG. 8, will have components surface mounted that project off the surface of the PCBA. A single sided version could place all the components on the upward facing side, as in FIG. 8, leaving the underside that contacts the LED COB flat. Alternatively a two-sided PCBA, populated on both sides, would require machining clearance spaces on the face of the heat sink, or providing a large enough clearance 35 for the components (as by not forming a recess in either the PCB back or the heat sink, which is a possibility in any embodiment, but without the benefit of helping locate the LED array properly on the PCB).

Certain components typically required to drive an LED perform better if they have heat sinking to draw heat away from the component. In an optimal driver design these heat generating components would be placed on the underside of the PCBA, for a shorter heat travel path.

The LED is a heat generating device, and locating the driver components adjacent to the LED COB means those components are exposed to more heat and the overall power of the device may need to be controlled to ensure the electrical components are not exposed to excessive heat. Proper design requires adequately designing the heat sink to handle the thermal load of both the LED array and the driver components.

As explained above, the donut or annular shape of the PCB of the invention is preferred, but it could be square or otherwise polygonal, at least at the perimeter. In a more basic form of the invention, the PCB will not have the LED driver electronics, but the PCB with the spring arms forms an efficient assembly, with the spring arms applying pressure for efficient thermal transfer as well as good electrical contact to deliver power to the LED. In this way the PCB is an efficient LED holder, transferring the electrical contact to a remote driver in the light assembly, using conductive layers provided in the PCB. In the preferred embodiment described above, the driver electronics contained on the PCB provides for a high degree for space efficiency, especially for designs requiring a lightweight, compact system.

The above described preferred embodiments are intended to illustrate the principles of the invention, but not to limit its scope. Other embodiments and variations to these preferred embodiments will be apparent to those skilled in the art and may be made without departing from the spirit and scope of the invention as defined in the following claims.

We claim:

1. In an LED light assembly, an LED array mounted in a space efficient manner against a heat sink, the assembly comprising: an LED array on a heat conducting substrate, a printed circuit board (PCB) with a central opening sized to receive the LED array, the PCB having pairs of slits extending into the board from the central opening, so as to form a plurality of cantilevered spring arms in the board, some of the spring arms including PCB electrical contacts positioned to press down against the LED's heat conducting substrate when the LED array is assembled against the back side of the printed circuit board, and the heat conducting substrate of the LED array having mating LED electrical contacts in position to be engaged with the PCB electrical contacts, a heat sink plate assembled behind the LED array such that a back side of the heat conducting substrate of the LED array is pressed against the heat sink plate, and the printed circuit board being secured to the heat sink plate by fasteners such that the spring arms are deflected and push down on the heat conducting substrate of the LED array, to make both electrical contact with the LED array and heat transfer contact of the LED heat conducting substrate with the heat sink plate, thereby providing a compact, efficient retention assembly for the LED array.

2. The portable light assembly of claim 1, including four said spring arms at generally even spacing around the central opening.

3. The portable light assembly of claim 2, wherein the central opening, and the LED array, are circular.

4. The portable light assembly of claim 1, wherein the LED array is a COB array.

5. The portable light assembly of claim 1, wherein the back side of the printed circuit board is routed to form a shallow recess around the central opening, the central opening being round, the recess having a plurality of expanded corners, and the conducting substrate of the LED array having a plurality of corners, each of which lies against an expanded corner of the recess, two of the corners of the LED's heat conducting substrate having said mating LED electrical contacts, and the PC board bearing against the LED's heat conducting substrate only at said corners of the heat conducting substrate and of the recess, where the spring arms are located on the PC board.

6. The portable light assembly of claim 5, wherein two opposed ones of said spring arms include said PCB electrical contacts, and two further spring arms bear against the heat conducting substrate solely to press the heat conducting substrate against the heat sink plate for heat transfer.

7. The portable light assembly of claim 1, wherein said fasteners are machine screws engaged in threaded holes of the heat sink plate.

8. The portable light assembly of claim 1, wherein the PCB is of the material FR4.

9. The portable light assembly of claim 1, wherein the heat conducting substrate of the LED array is ceramic.

10. The portable light assembly of claim 1, wherein the printed circuit board has on at least one surface LED driver electronics for the LED array, connected to the PCB electrical contacts.

11. In a portable light assembly, a circular LED array mounted in a space efficient manner against a heat sink, the assembly comprising: a circular LED array in a tight cluster, on a heat conducting substrate, a printed circuit board annular in shape and with a central opening sized to receive the circular LED array, the printed circuit board having on at least one surface LED driver electronics, the annular PCB having pairs of slits extending into the board from the central opening, so as to form a plurality of cantilevered spring arms in the board, some of the spring arms including PCB electrical contacts positioned to press down against the LED's heat conducting substrate when the LED array is assembled against the back side of the printed circuit board, and the heat conducting substrate of the LED array having mating LED electrical contacts in position to be engaged with the PCB electrical contacts, a heat sink plate assembled behind the LED array such that a back side of the heat conducting substrate of the LED array is pressed against the heat sink plate, and the annular printed circuit board being secured to the heat sink plate by fasteners such that the spring arms are deflected and push down on the heat conducting substrate of the LED array, to make both electrical contact with the LED array and heat transfer contact of the LED heat conducting substrate with the heat sink plate, whereby the LED driver electronics are essentially coplanar with the LED array, providing a compact assembly and avoiding a need for a special LED holder.

* * * * *